(12) United States Patent
Tange et al.

(10) Patent No.: US 9,282,268 B2
(45) Date of Patent: Mar. 8, 2016

(54) SOLID-STATE IMAGE PICKUP DEVICE, METHOD OF MANUFACTURING SOLID-STATE IMAGE PICKUP DEVICE, AND IMAGE PICKUP SYSTEM

(71) Applicant: CANON KABUSHIKI KAISHA, Tokyo (JP)

(72) Inventors: Tsutomu Tange, Yokohama (JP); Ginjiro Toyoguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 103 days.

(21) Appl. No.: 14/052,883

(22) Filed: Oct. 14, 2013

(65) Prior Publication Data

US 2014/0104474 A1    Apr. 17, 2014

(30) Foreign Application Priority Data

Oct. 16, 2012 (JP) ................................. 2012-229038

(51) Int. Cl.
*H04N 5/3745*    (2011.01)
*H01L 27/146*    (2006.01)

(52) U.S. Cl.
CPC ........ *H04N 5/3745* (2013.01); *H01L 27/14623* (2013.01); *H01L 27/14627* (2013.01); *H01L 27/14629* (2013.01); *H01L 27/14685* (2013.01)

(58) Field of Classification Search
CPC ........... H04N 5/3745; H01L 27/14685; H01L 27/14629; H01L 27/14627; H01L 27/14623
USPC ............... 348/308, 294, 297, 345; 250/208.1; 438/69; 257/291, 292, 294, 444
See application file for complete search history.

(56) References Cited

U.S. PATENT DOCUMENTS

| 8,243,186 | B2* | 8/2012 | Yamazaki | H01L 27/14627 257/436 |
| 8,582,019 | B2* | 11/2013 | Fujii et al. | 348/350 |
| 2011/0089514 | A1* | 4/2011 | Tay | H01L 27/14603 257/432 |
| 2011/0102651 | A1* | 5/2011 | Tay | H01L 27/14625 348/280 |
| 2011/0199521 | A1* | 8/2011 | Kato | H01L 27/14625 348/294 |
| 2011/0273599 | A1* | 11/2011 | Murata | G02B 7/36 348/294 |
| 2011/0279727 | A1* | 11/2011 | Kusaka | H01L 27/14621 348/340 |
| 2012/0012964 | A1* | 1/2012 | Kishi | H01L 27/14623 257/435 |
| 2012/0133809 | A1* | 5/2012 | Yamada | 348/294 |

FOREIGN PATENT DOCUMENTS

| JP | 2009-105358 A | 5/2009 |
| JP | 2011-176715 A | 9/2011 |
| JP | 2011-222827 A | 11/2011 |
| JP | 2012-151367 A | 8/2012 |

* cited by examiner

*Primary Examiner* — Tuan Ho
*Assistant Examiner* — Marly Camargo
(74) *Attorney, Agent, or Firm* — Canon USA, Inc. IP Division

(57) ABSTRACT

A solid-state image pickup device includes an array of a first pixel and a second pixel. The second pixel includes a light shielding portion provided above a photoelectric conversion portion thereof and configured to block some of incident light so as to perform focus detection, and a light guiding portion provided at least above an upper face of the light shielding portion.

11 Claims, 8 Drawing Sheets

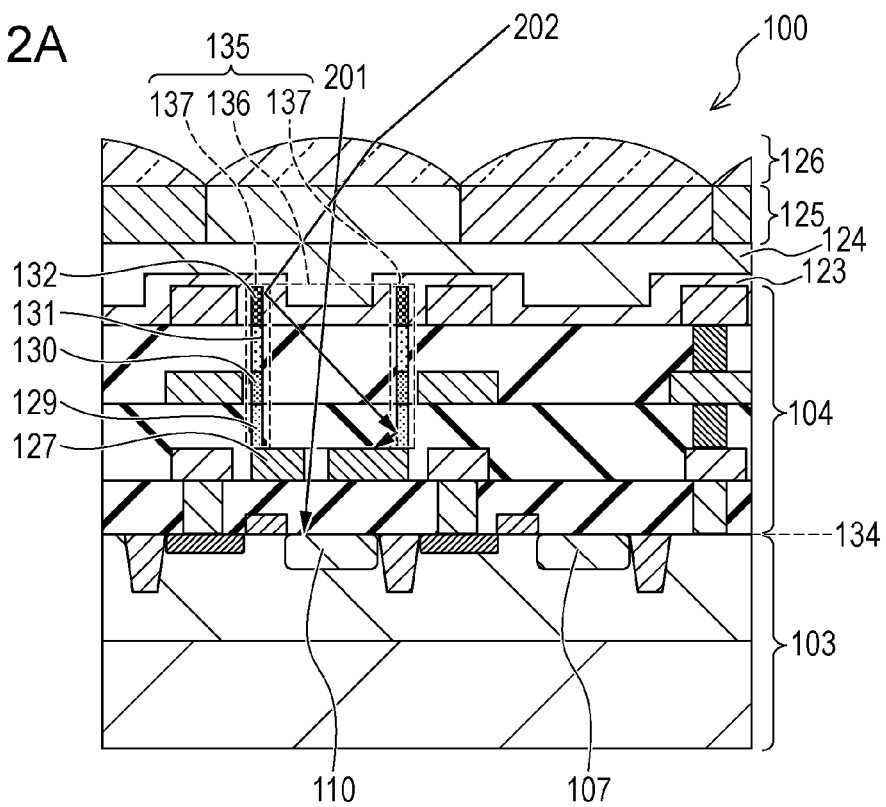
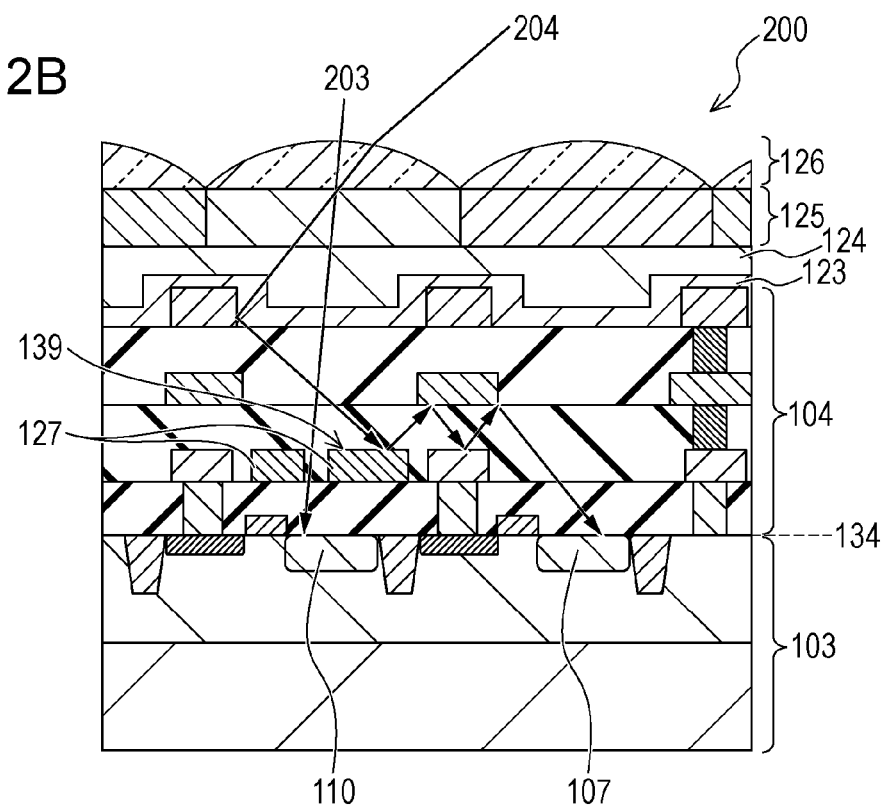

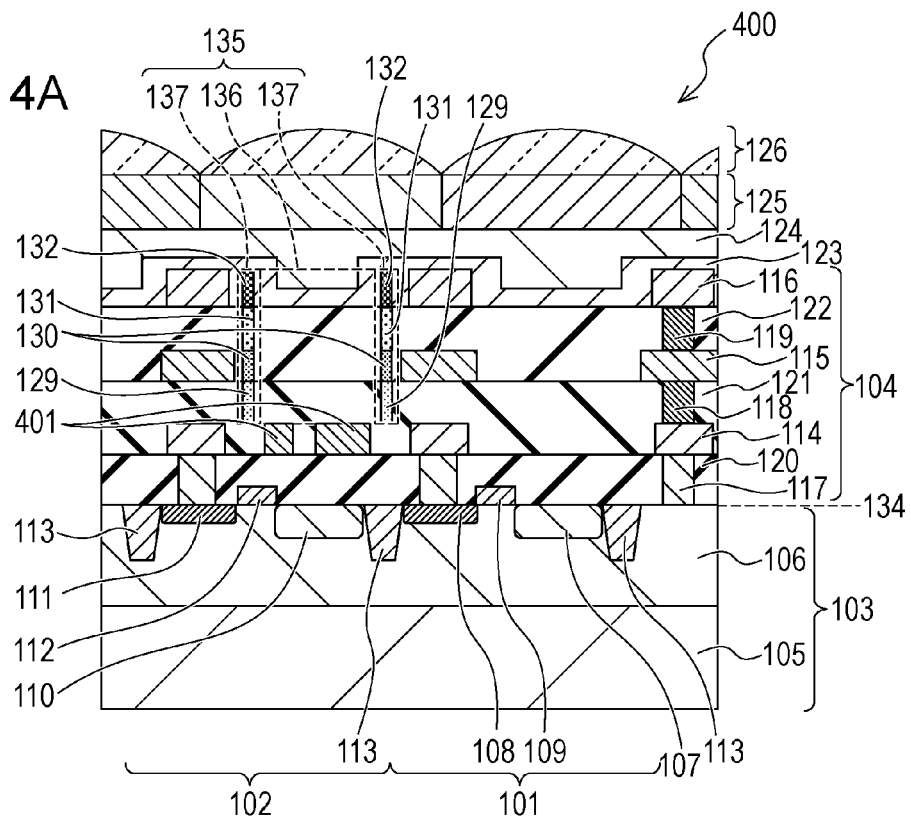
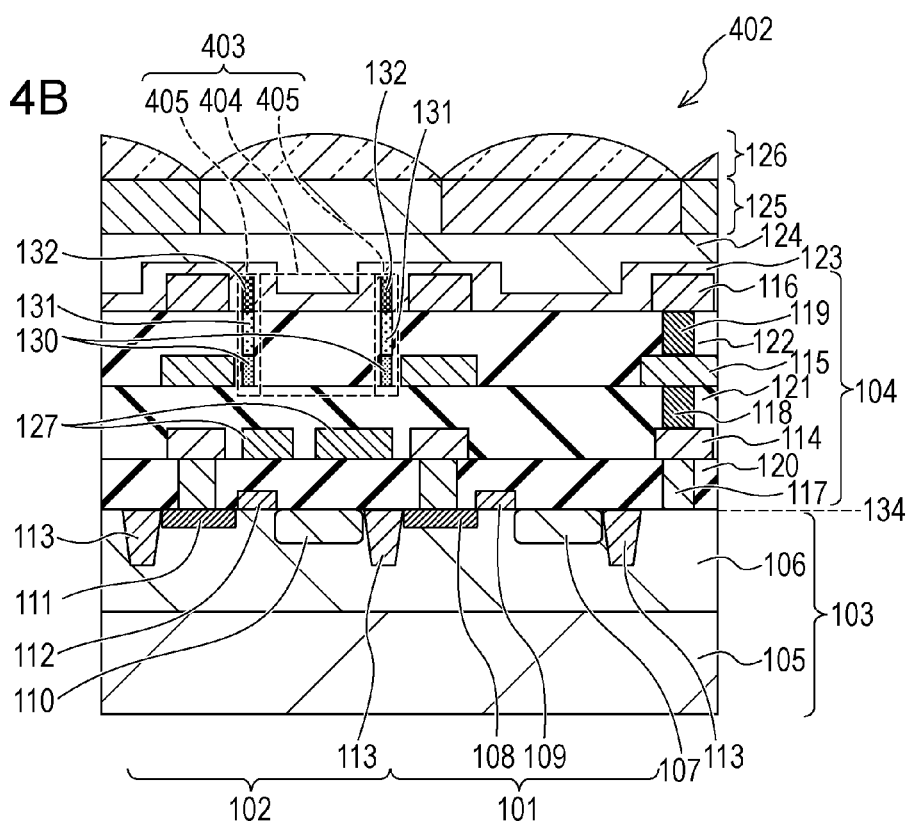

SOLID-STATE IMAGE PICKUP DEVICE, METHOD OF MANUFACTURING SOLID-STATE IMAGE PICKUP DEVICE, AND IMAGE PICKUP SYSTEM

BACKGROUND OF THE INVENTION

1. Field of the Invention

One disclosed aspect of the embodiments relates to a solid-state image pickup device, a method of manufacturing a solid-state image pickup device, and an image pickup system including a solid-state image pickup device.

2. Description of the Related Art

In some known solid-state image pickup devices included in image pickup systems such as digital still cameras, pixels for focus detection are provided in a pixel area where pixels for image pickup are arranged. For example, Japanese Patent Laid-Open No. 2009-105358 discloses a configuration in which pixels for focus detection each include a light shielding portion that defines a path of incident light.

SUMMARY OF THE INVENTION

According to a first aspect of the embodiments, there is provided a solid-state image pickup device including an array of a first pixel and a second pixel. The first pixel and the second pixel each include a photoelectric conversion portion, a microlens provided in correspondence with the photoelectric conversion portion, and a wiring layer provided between the photoelectric conversion portion and the microlens and including a plurality of layers. The second pixel includes a light shielding portion provided above the photoelectric conversion portion and between any two of the layers included in the wiring layer, the light shielding portion being configured to block some of incident light so as to perform focus detection; and a light guiding portion provided at least above an upper face of the light shielding portion.

According to a second aspect of the embodiments, there is provided a method of manufacturing a solid-state image pickup device, the apparatus including an array of a first pixel and a second pixel, the first pixel and the second pixel each including a photoelectric conversion portion; a multilayer wiring structure; and a microlens provided at the top thereof. The method includes forming the multilayer wiring structure in each of areas that are to become the first pixel and the second pixel, forming a light shielding portion in the area that is to become the second pixel, and forming a light guiding portion in the area that is to become the second pixel. A part of the forming of the multilayer wiring structure is performed simultaneously with the forming of the light shielding portion. Another part of the forming of the multilayer wiring structure is performed simultaneously with the forming of the light guiding portion.

According to a third aspect of the embodiments, there is provided a solid-state image pickup device including an array of a first pixel and a second pixel. The first pixel and the second pixel each include a photoelectric conversion portion, a microlens provided in correspondence with the photoelectric conversion portion, and a wiring layer provided between the photoelectric conversion portion and the microlens and including a plurality of layers. The second pixel includes a light shielding portion provided above the photoelectric conversion portion and between any two of the layers included in the wiring layer, the light shielding portion being configured to block some of incident light so as to perform focus detection; and a light guiding portion provided in contact with an upper face of the light shielding portion and above the upper face of the light shielding portion, the light guiding portion including a first portion and a second portion provided around the first portion and made of a material having a lower refractive index with respect to the incident light than the first portion.

Further features of the disclosure will become apparent from the following description of exemplary embodiments with reference to the attached drawings.

BRIEF DESCRIPTION OF THE DRAWINGS

FIG. 2A is another schematic sectional view of the solid-state image pickup device according to the first embodiment.

FIG. 2B is a schematic sectional view of a comparative solid-state image pickup device.

FIG. 4A is a schematic sectional view illustrating a modification of the solid-state image pickup device according to the first embodiment.

FIG. 4B is a schematic sectional view illustrating another modification of the solid-state image pickup device according to the first embodiment.

DESCRIPTION OF THE EMBODIMENTS

Depending on the configuration of the solid-state image pickup device, light that has been reflected by the light shielding portion that defines the path of incident light may enter some of the pixels for image pickup that are provided around the pixels for focus detection, causing so-called crosstalk.

Accordingly, one disclosed aspect of the embodiments provides a solid-state image pickup device that includes pixels for focus detection and causes less crosstalk.

A solid-state image pickup device according to an embodiment includes an array of first pixels and second pixels. The second pixels each include a light shielding portion provided above a photoelectric conversion portion and configured to block some of incident light so as to perform focus detection. Furthermore, the second pixels each include a light guiding portion provided at least above an upper face of the light shielding portion. With such a configuration, a solid-state image pickup device that causes less crosstalk is provided.

Hereinafter, the term "light shielding (light shielding portion)" implies that 100% of incident light is not necessarily blocked. Moreover, the light shielding portion only needs to reduce the transmittance with respect to light at least in a certain wavelength range. For example, the light shielding portion only needs to reflect or absorb even a small quantity of light in a certain wavelength range. The term "a certain wavelength range" refers to, for example, a wavelength range of about 400 nm to about 750 nm for a solid-state image pickup device that uses visible light. The wavelength range is changeable in accordance with the use of the solid-state image pickup device.

Embodiments of the disclosure will now be described with reference to the accompanying drawings. The following embodiments each concern a complementary-metal-oxide-semiconductor (CMOS) solid-state image pickup device.

First Embodiment

Figure 1A:
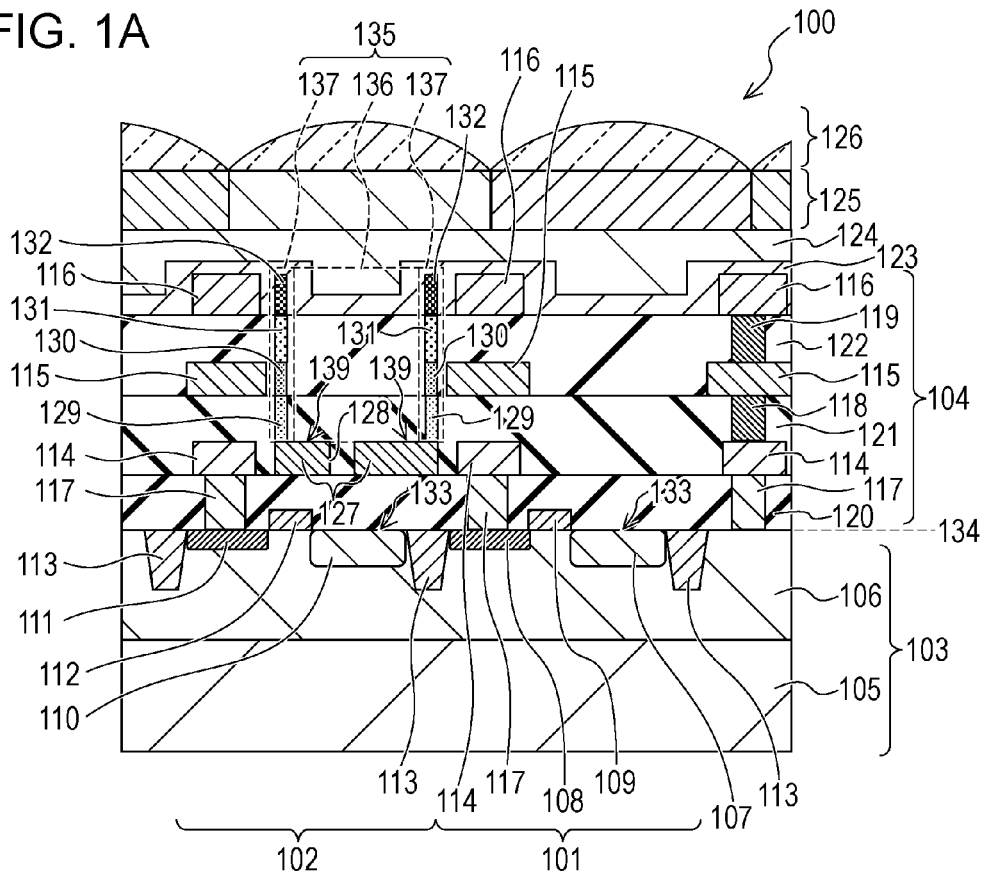
FIG. 1A is a schematic sectional view of a solid-state image pickup device according to a first embodiment.
Figure 1B:
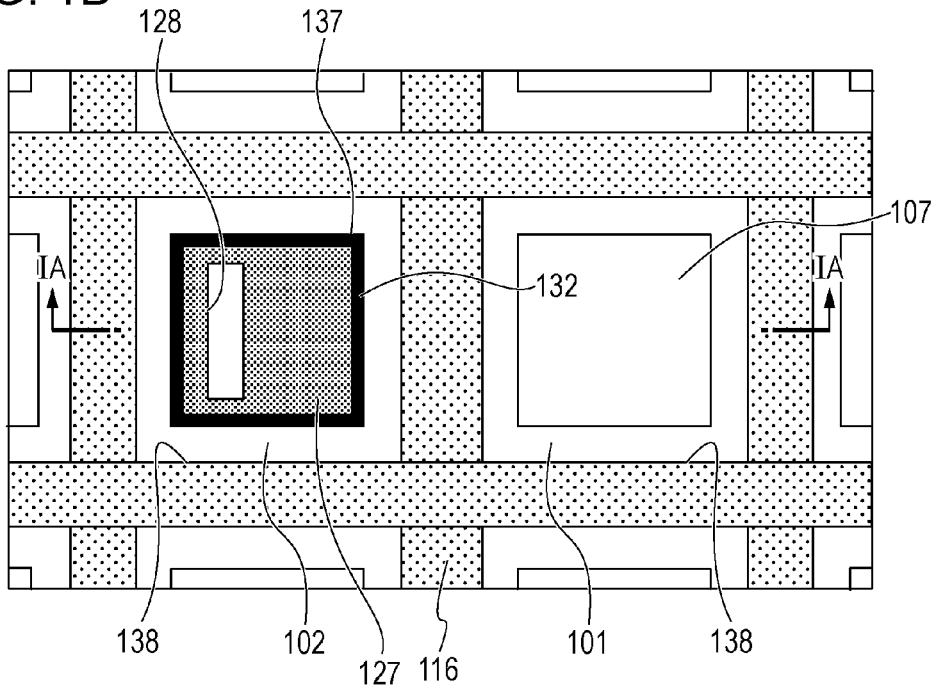
FIG. 1B is a schematic plan view of the solid-state image pickup device according to the first embodiment.

A solid-state image pickup device according to a first embodiment will first be described with reference to FIGS. 1A and 1B, 2A and 2B, and 3A to 3C. The solid-state image pickup device according to the first embodiment includes pixels for image pickup (hereinafter referred to as first pixels) and pixels for focus detection (hereinafter referred to as second pixels). FIG. 1A is a schematic sectional view of a part of a solid-state image pickup device 100 according to the first embodiment illustrating one of first pixels 101 and one of second pixels 102. FIG. 1B is a schematic plan view of the part illustrated in FIG. 1A. FIG. 1A corresponds to a section taken along line IA-IA illustrated in FIG. 1B. The pixels for focus detection will be described in detail separately below.

Referring to FIG. 1A, the solid-state image pickup device 100 includes the first pixels 101 and the second pixels 102. These pixels 101 and 102 each include a semiconductor substrate 103 and a multilayer wiring structure 104. Some elements are provided with the semiconductor substrate 103. A protective film 123, a planarizing layer 124, a color filter layer 125 including a plurality of color filters, and a lens layer 126 including a plurality of microlenses are provided on the multilayer wiring structure 104. The protective film 123 described herein has a monolayer structure but may have a multilayer structure. The protective film 123 mechanically or chemically protects the multilayer wiring structure 104. Each of the plurality of color filters is provided for one pixel, for example. Likewise, each of the plurality of microlenses is provided for one pixel, for example.

The semiconductor substrate 103 is, for example, a silicon semiconductor substrate and may have a semiconductor region including an epitaxial layer, a well, and so forth. In the first embodiment, the semiconductor substrate 103 includes an n-type semiconductor region 105 and a p-type semiconductor region 106 provided on the semiconductor region 105 and functioning as a well. The elements include a photoelectric conversion portion (hereinafter referred to as PD portion) as a photodiode, a transfer gate electrode (hereinafter referred to as TX electrode), and a floating diffusion portion (hereinafter referred to as FD portion). The PD portion, the TX electrode, and the FD portion in combination form a metal-oxide-semiconductor (MOS) transistor. Elements included in each of the first pixels 101 include a first PD portion 107, a first FD portion 108, and a first TX electrode 109. Elements included in each of the second pixels 102 include a second PD portion 110, a second FD portion 111, and a second TX electrode 112. The semiconductor substrate 103 further includes element isolating portions 113 that each isolate a group of the foregoing elements from another group of the elements. The PD portions each have a light receiving face 133. A face 134 of the semiconductor substrate 103 corresponds to an interface between the semiconductor substrate 103 and an insulator, specifically, an interface between the semiconductor substrate 103 and a gate insulator film of the MOS transistor. The face 134 contains the light receiving face 133.

The multilayer wiring structure 104 includes, for example, a plurality of wiring layers, a contact layer, a plurality of via layers, and a plurality of insulating films. The plurality of wiring layers include a wiring layer 114, a wiring layer 115, and a wiring layer 116 that each include a plurality of wires. The contact layer includes a contact layer 117 that includes a plurality of contact plugs. The plurality of via layers include a via layer 118 and a via layer 119 that each include a plurality of via plugs. The plurality of insulating films include an insulating film 120, an insulating film 121, and an insulating film 122.

In the solid-state image pickup device 100 configured as described above, the second pixel 102 includes a light shielding portion 127 for focus detection. Furthermore, a light guiding portion 135 is provided above the light shielding portion 127. The light guiding portion 135 includes a first portion 136 and a second portion 137. The second portion 137 is made of a material having a lower transmittance with respect to incident light than the material of the first portion 136. The light guiding portion 135 is provided at least above an upper face 139 of the light shielding portion 127. The first portion 136 is made of silicon oxide. The light shielding portion 127 and the second portion 137 are each made of a material having a lower transmittance with respect to incident light than silicon oxide. Specifically, the light shielding portion 127 and the second portion 137 are each made of a metallic material such as aluminum, copper, or tungsten, or an organic material containing a black pigment. In view of the manufacturing process, a metallic material is suitable for the light shielding portion 127 and the second portion 137. The light shielding portion 127 blocks some of incident light so as to perform focus detection.

Referring now to FIG. 1B, the positions of the light shielding portion 127 and the light guiding portion 135 will be described. FIG. 1B is a top view, i.e., a plan view, illustrating some of the members described above, or an orthogonal projection of the members onto the face 134. As illustrated in FIG. 1B, the wiring layer 116 has a lattice pattern and extends over the plurality of pixels. Openings 138 in the lattice pattern of the wiring layer 116 are provided in correspondence with the PD portions and each define the aperture through which light is incident on a corresponding one of the PD portions. Each of the openings 138 provided for the first pixels 101 encloses the light receiving face 133 of one first PD portion 107. Each of the openings 138 provided for the second pixels 102 encloses one light shielding portion 127, an opening 128 of that light shielding portion 127, and one second portion 137. The second PD portion 110 is covered with the light shielding portion 127. Hence, light defined by the opening 128 is incident on the second PD portion 110. The second portion 137, which has a frame shape, extends along the outer edge of the light shielding portion 127. The outer edge of the light shielding portion 127 coincides with the outer edge of the second portion 137. As illustrated in FIGS. 1A and 1B, the second portion 137 has a shape enclosing the first portion 136 along the outer edge of the light shielding portion 127.

The presence of the light guiding portion 135 provided above the light shielding portion 127 reduces crosstalk. How crosstalk occurs will now be described with reference to FIGS. 2A and 2B.

FIG. 2A illustrates how light rays 201 and 202 at different incident angles travel in the solid-state image pickup device 100 illustrated in FIG. 1A. FIG. 2B illustrates how light rays 203 and 204 at the same incident angles as the light rays 201 and 202, respectively, travel in a comparative solid-state image pickup device 200. In FIG. 2A, only major members are denoted by corresponding ones of the reference numerals used in FIG. 1A. In FIG. 2B, members that are the same as those illustrated in FIG. 2A are denoted by corresponding ones of the reference numerals used in FIG. 2A, and description of such members is thus omitted. The comparative solid-state image pickup device 200 differs from the solid-state image pickup device 100 in not including the light guiding portion 135. That is, the solid-state image pickup device 200 illustrated in FIG. 2B is the same as the solid-state image pickup device 100 illustrated in FIG. 2A except the light guiding portion 135.

First, cases of the light ray 201 and the light ray 203 that are incident substantially perpendicularly on the solid-state image pickup device 100 and the solid-state image pickup device 200, respectively, will be described. In these cases, as illustrated in FIGS. 2A and 2B, the light ray 201 and the light ray 203 each pass through the opening 128 provided in the light shielding portion 127 and fall onto the second PD portion 110. Now, cases of the light ray 202 and the light ray 204 that are obliquely incident on the solid-state image pickup device 100 and the solid-state image pickup device 200, respectively, will be described. In the case illustrated in FIG. 2B, the light ray 204 is reflected by the upper face 139 of the light shielding portion 127 and eventually falls onto the first PD portion 107. In contrast, in the case illustrated in FIG. 2A, the light ray 202 that has been incident on the solid-state image pickup device 100 including the light guiding portion 135 travels through the first portion 136 while being reflected by some parts of the second portion 137. Therefore, the light ray 202 does not fall onto the first PD portion 107 of the first pixel 101 that is adjacent to the second pixel 102. This means that the presence of the light guiding portion 135 reduces crosstalk.

Figure 3A:
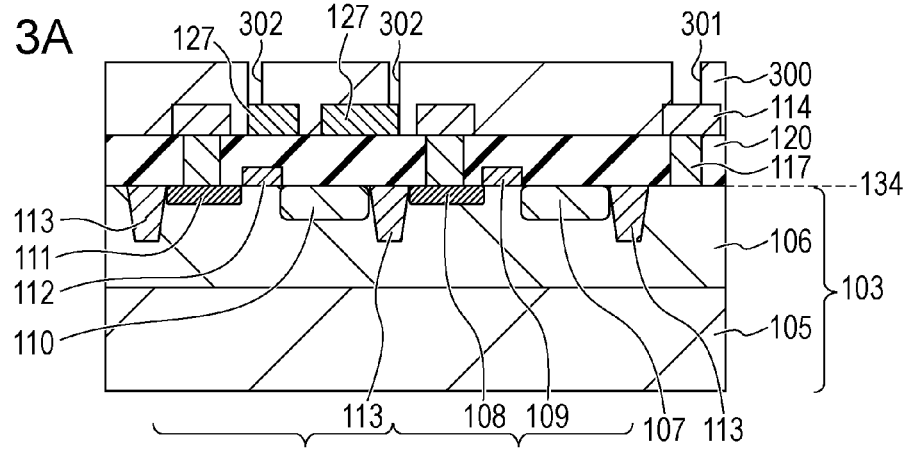
FIG. 3A is a schematic sectional view illustrating a method of manufacturing the solid-state image pickup device according to the first embodiment.
Figure 3B:
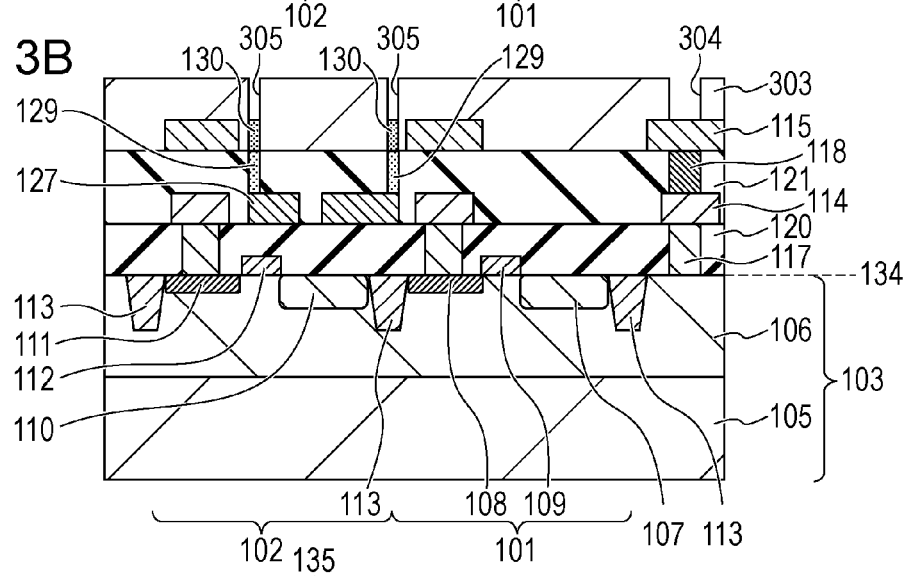
FIG. 3B is another schematic sectional view illustrating the method of manufacturing the solid-state image pickup device according to the first embodiment.
Figure 3C:
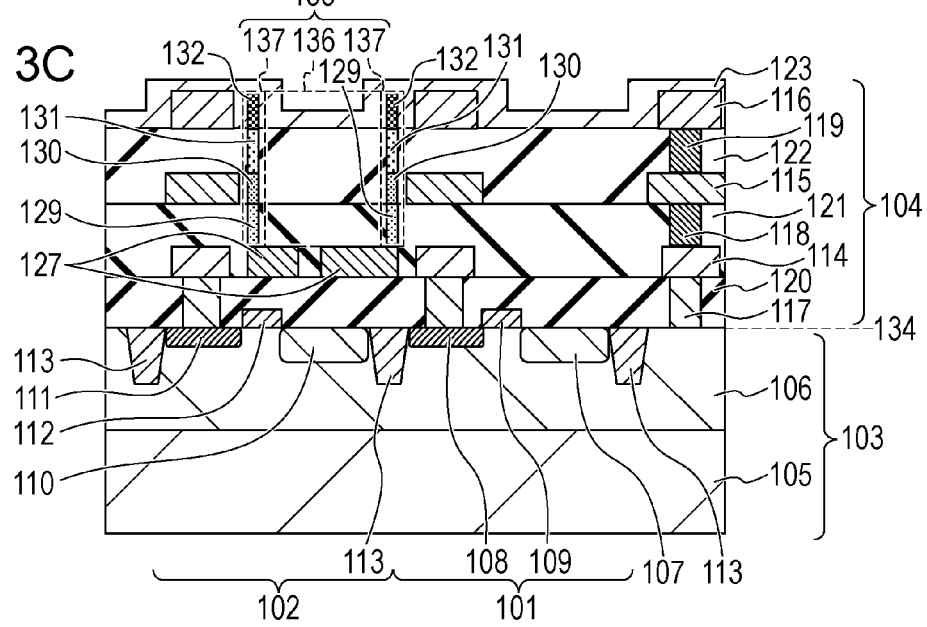
FIG. 3C is yet another schematic sectional view illustrating the method of manufacturing the solid-state image pickup device according to the first embodiment.

FIGS. 3A, 3B, and 3C are schematic sectional views illustrating a method of manufacturing the solid-state image pickup device according to the first embodiment. Herein, description of members that are fabricatable through common semiconductor processes is omitted. Materials of the members employed in the manufacturing method according to the first embodiment are only exemplary.

First, a semiconductor substrate 103 is prepared. The semiconductor substrate 103 is provided with some elements. A contact layer 117 and an insulating film 120 are provided on the semiconductor substrate 103. The semiconductor substrate 103 includes a semiconductor region 105 and a semiconductor region 106. The elements are provided in the semiconductor region 106. The elements include a first PD portion 107, a first FD portion 108, a second PD portion 110, and a second FD portion 111, all of which in combination form, for example, an n-type semiconductor region and function as a signal carrier for electrons in the first embodiment. The insulating film 120 is a layer that is made of, for example, silicon oxide. The insulating film 120 may include a plurality of layers. The contact layer 117 includes a plurality of contact plugs provided in openings of the insulating film 120. The contact plugs are each, for example, a stack of a barrier portion that is made of barrier metal such as titanium or titanium nitride and a conductive portion that is made of tungsten. The elements, the insulating film 120, and the contact layer 117 are fabricatable through common semiconductor processes. Subsequently, a wiring layer 114 and a light shielding portion 127 are formed on the insulating film 120. The wiring layer 114 and the light shielding portion 127 are each, for example, a stack of a barrier portion that is made of barrier metal such as titanium or titanium nitride and a conductive portion that is made of aluminum. The light shielding portion 127 resides at the same level as the wiring layer 114. The light shielding portion 127 and the wiring layer 114 can be formed simultaneously through a common semiconductor process. Subsequently, the wiring layer 114 and the light shielding portion 127 are covered with a film 300. The film 300 is made of, for example, silicon oxide and is to become an insulating film 121. Subsequently, an opening 301 and an opening 302 are provided at respective predetermined positions in the film 300. The opening 301 is for a via plug that provides a connection to a wire included in the wiring layer 114. The opening 302 is for a second portion 137 of a light guiding portion 135 that is to be formed above the light shielding portion 127. The openings 301 and 302 can be provided simultaneously and by common photolithographic and etching techniques. FIG. 3A illustrates a state where the opening 301 and the opening 302 have been provided in the film 300.

Subsequently, a via plug as, for example, a stack of a barrier portion that is made of barrier metal such as titanium or titanium nitride and a conductive portion that is made of tungsten is formed in the opening 301, whereby a via layer 118 is obtained. Furthermore, a part 129 of a second portion 137 is formed in the opening 302. The part 129 is, for example, a stack of a barrier portion that is made of barrier metal such as titanium or titanium nitride and a conductive portion that is made of tungsten. The barrier portions and the conductive portions included in the via layer 118 and the part 129 of the second portion 137 can be formed simultaneously. The film 300 functions as an insulating film 121. A part of the insulating film 121 functions as a part of a first portion 136. Subsequently, a wiring layer 115 and a part 130 of the second portion 137 are formed on a combination of the via layer 118, the part 129 of the second portion 137, and the insulating film 121. The wiring layer 115 and the part 130 of the second portion 137 can be formed in the same manner as for the wiring layer 114 and the light shielding portion 127. Subsequently, the wiring layer 115 and the part 130 of the second portion 137 are covered with a film 303. The film 303 is made of, for example, silicon oxide and is to become an insulating film 122. Subsequently, as with the openings 301 and 302, an opening 304 and an opening 305 are provided at respective predetermined positions in the film 303. The opening 304 is for a via plug that provides a connection to a wire included in the wiring layer 115. The opening 305 is for the second portion 137. The openings 304 and 305 can be provided simultaneously. FIG. 3B illustrates a state where the opening 304 and the opening 305 have been provided in the film 303.

Subsequently, as with the via layer 118, a via plug is formed in the opening 304 by forming a barrier portion and a conductive portion, whereby a via layer 119 is obtained. Furthermore, as with the part 129 of the second portion 137, a part 131 of the second portion 137 is formed in the opening 305 by forming a barrier portion and a conductive portion. The barrier portions and the conductive portions included in the via layer 119 and the part 131 of the second portion 137 can be formed simultaneously. The film 303 functions as an insulating film 122. A part of the insulating film 122 forms a part of the first portion 136. Subsequently, a wiring layer 116 and a part 132 of the second portion 137 are formed on a combination of the via layer 119, the part 131 of the second portion 137, and the insulating film 122. The wiring layer 116 and the part 132 of the second portion 137 can be formed in the same manner as for the wiring layer 114 and the light shielding portion 127. Subsequently, a protective film 123 is formed over the wiring layer 116, the part 132 of the second portion 137, and the insulating film 122, whereby a structure illustrated in FIG. 3C is obtained.

Subsequently, as illustrated in FIG. 1A, a planarizing layer 124 that is made of an organic material is formed. Furthermore, color filters having a plurality of colors are formed, whereby a color filter layer 125 is obtained. Furthermore, a lens layer 126 including a plurality of microlenses is formed on the color filter layer 125. Through the above manufacturing method, the solid-state image pickup device according to the first embodiment is obtained.

The method of manufacturing the solid-state image pickup device according to the first embodiment is appropriately changeable. For example, the light shielding portion and a corresponding one of the wiring layers or each of the other wiring layers and a corresponding one of the parts of the second portion may be formed separately while each of the via layers and a corresponding one of the parts of the second portion may be formed separately. Moreover, each of the openings for the via layers and a corresponding one of the openings for the parts of the second portion may be provided simultaneously while the barrier portions and the conductive portions to be formed therein may be formed separately. Particularly, if the openings, the barrier portions, and the conductive portions that are provided in forming the light shielding portion, the second portion of the light guiding portion, the via layers, and the wiring layers are provided simultaneously, the number of manufacturing steps is reduced. Furthermore, the number of temperature requirements for forming the members excluding the second portion is reduced more than in a case where the light shielding portion and the second portion are made of organic materials or the like.

The pixels only need to be provided as a repetition of the smallest unit. In the first embodiment, the boundary between adjacent ones of the pixels corresponds to the position of the element isolating portion 113 provided between the second PD portion 110 and the first FD portion 108 illustrated in FIG. 1A. Alternatively, for example, the boundary between adjacent ones of the pixels may be defined between the first FD portion 108 and the first TX electrode 109 illustrated in FIG. 1A.

In the first embodiment, the second pixel 102 can be provided with a transparent color filter. With the presence of a transparent color filter, the dependence of focus detection upon the wavelength of incident light is reduced. A transparent color filter allows a larger quantity of light to be transmitted therethrough and be reflected by the light shielding portion 127 than any colored filters. Therefore, the effectiveness of providing the light guiding portion 135 is increased.

In the first embodiment, the wiring layer 116 defines the aperture for incident light. Alternatively, the aperture may be defined by any other wiring layer. In the first embodiment, the second portion 137 has a frame shape. Alternatively, the second portion 137 may have, for example, a columnar shape. That is, the orthogonal projection of the second portion 137 onto the face 134 is not necessarily a closed-loop shape. Moreover, a plurality of second portions 137 may be provided. Furthermore, the orthogonal projection of the second portion 137 onto the face 134 may reside on the inner side of the outer edge of the orthogonal projection of the light shielding portion 127 onto the face 134.

In the first embodiment, the light shielding portion 127 may have an opening in the form of any slit other than the opening 128 illustrated in FIG. 1B. The light shielding portion 127 is not limited to be provided at the same level as the wiring layer 114 and may be provided at any level and at any position.

The light guiding portion according to any of the first and the following embodiments is provided at least above the upper face of the light shielding portion and may extend up to a position below the upper face of the light shielding portion. Such a configuration also reduces the quantity of light that may spread because of diffraction or the like and enter any PD portions of adjacent pixels after passing through the opening of the light shielding portion.

Modifications of First Embodiment

FIGS. 4A and 4B are schematic sectional views illustrating modifications of the solid-state image pickup device according to the first embodiment. In FIGS. 4A and 4B, members that are the same as those illustrated in FIG. 1A are denoted by corresponding ones of the reference numerals used in FIG. 1A, and description of such members is thus omitted. A solid-state image pickup device 400 illustrated in FIG. 4A and a solid-state image pickup device 402 illustrated in FIG. 4B differ from the solid-state image pickup device 100 illustrated in FIG. 1A in the configurations of the light shielding portion and the light guiding portion. Specifically, while the light guiding portion 135 and the light shielding portion 127 included in the solid-state image pickup device 100 illustrated in FIG. 1A are in contact with each other, the light guiding portion and the light shielding portion included in each of the solid-state image pickup device 400 illustrated in FIG. 4A and the solid-state image pickup device 402 illustrated in FIG. 4B are not in contact with each other.

The solid-state image pickup device 400 illustrated in FIG. 4A includes a light shielding portion 401 having a different shape from the light shielding portion 127 illustrated in FIG. 1A. When the light shielding portion 401 is orthogonally projected onto the face 134, the orthogonal projection of the light shielding portion 401 is smaller than the orthogonal projection of the light shielding portion 127 illustrated in FIG. 1A onto the face 134. By employing the light shielding portion 401, the light shielding portion 401 and the light guiding portion 135 are at a certain distance from each other. In such a configuration also, the light guiding portion 135 is provided at least above the light shielding portion 401. Therefore, the quantity of light that may enter any PD portions of adjacent pixels after being reflected by the upper face of the light shielding portion 401 is reduced. A configuration similar to the configuration illustrated in FIG. 4A can be obtained by changing the position of the second portion instead of changing the shape of the light shielding portion 127 illustrated in FIG. 1A.

The solid-state image pickup device 402 illustrated in FIG. 4B includes a light guiding portion 403 having a different shape from the light guiding portion 135 illustrated in FIG. 1A. The light guiding portion 403 includes a first portion 404 and a second portion 405. The first portion 404 includes a part of the insulating film 122 and a part of the protective film 123. The second portion 405 includes the part 130, the part 131, and the part 132. The first portion 404 and the second portion 405 are shorter in a direction perpendicular to the face 134 than the first portion 136 and the second portion 137 illustrated in FIG. 1A. In such a configuration also, the light guiding portion 403 is provided at least above the light shielding portion 127. Therefore, the quantity of light that may enter any PD portions of adjacent pixels after being reflected by the upper face of the light shielding portion 127 is reduced. In addition, any of the parts 129, 130, 131, and 132 forming the second portion 137 illustrated in FIG. 1A, for example, the part 129 and the part 131, may be selectively provided.

Second Embodiment

A solid-state image pickup device according to a second embodiment differs from the solid-state image pickup device according to the first embodiment in the configuration of the light guiding portion. The solid-state image pickup device according to the second embodiment will now be described with reference to FIGS. 5 and 6A to 6C. In FIGS. 5 and 6A to 6C, members that are the same as those illustrated in FIG. 1A are denoted by corresponding ones of the reference numerals used in FIG. 1A, and description of such members is thus omitted.

Figure 5:
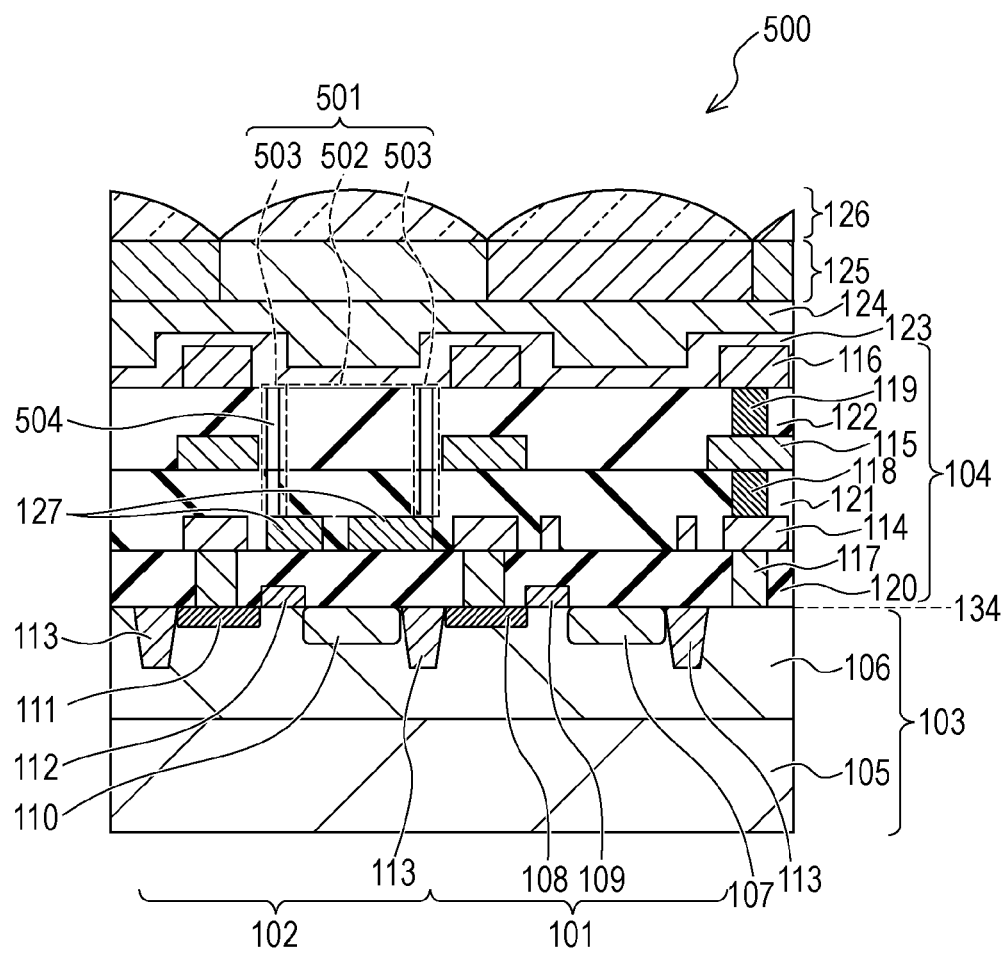
FIG. 5 is a schematic sectional view of a solid-state image pickup device according to a second embodiment.

FIG. 5 is a schematic sectional view of a solid-state image pickup device 500 according to the second embodiment. In the solid-state image pickup device 100 illustrated in FIG. 1A, the light guiding portion 135 includes the first portion 136 that is made of a transparent material and the second portion 137 that is made of a nontransparent material. In contrast, the solid-state image pickup device 500 illustrated in FIG. 5 includes a light guiding portion 501 including a first portion 502 that is made of a transparent material and a second portion 503 that is made of a transparent material with a lower refractive index than the material of the first portion 502. In such a configuration, light is reflected by an interface between the first portion 502 and the second portion 503. Therefore, the quantity of light that may enter any PD portions of adjacent pixels is reduced.

Figure 6A:
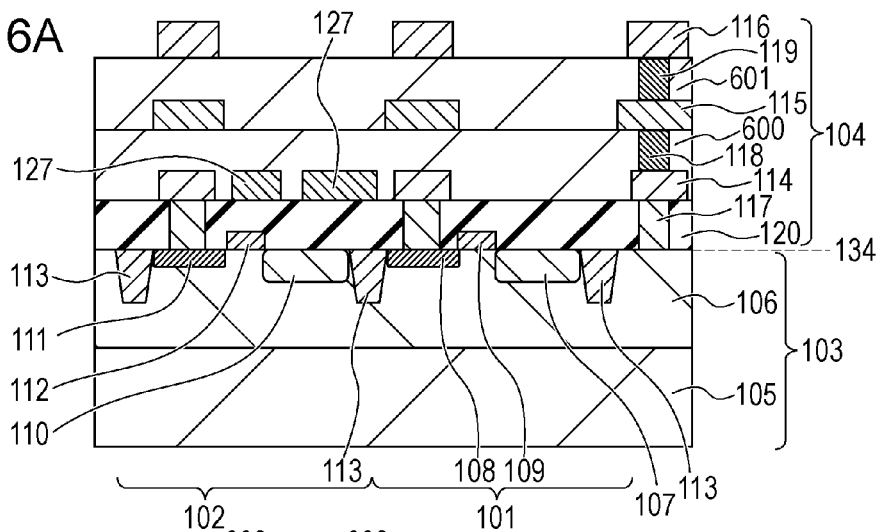
FIG. 6A is a schematic sectional view illustrating a method of manufacturing the solid-state image pickup device according to the second embodiment.
Figure 6B:
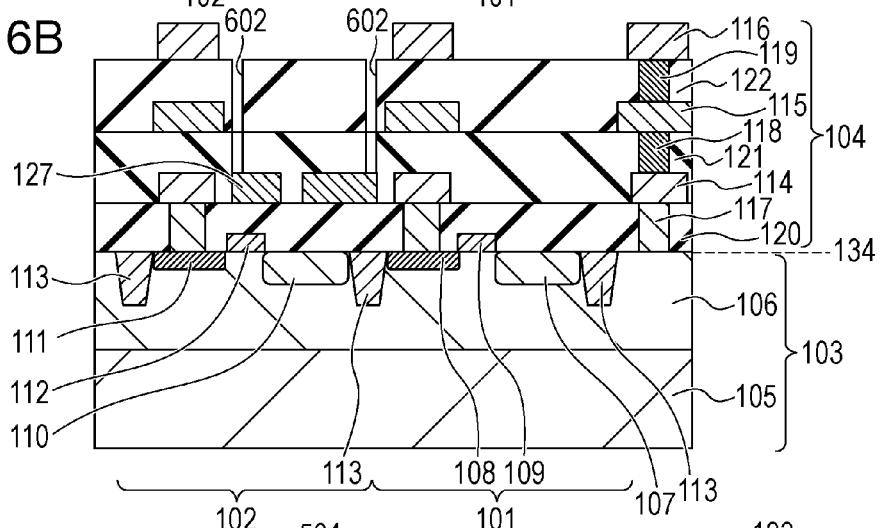
FIG. 6B is another schematic sectional view illustrating the method of manufacturing the solid-state image pickup device according to the second embodiment.
Figure 6C:
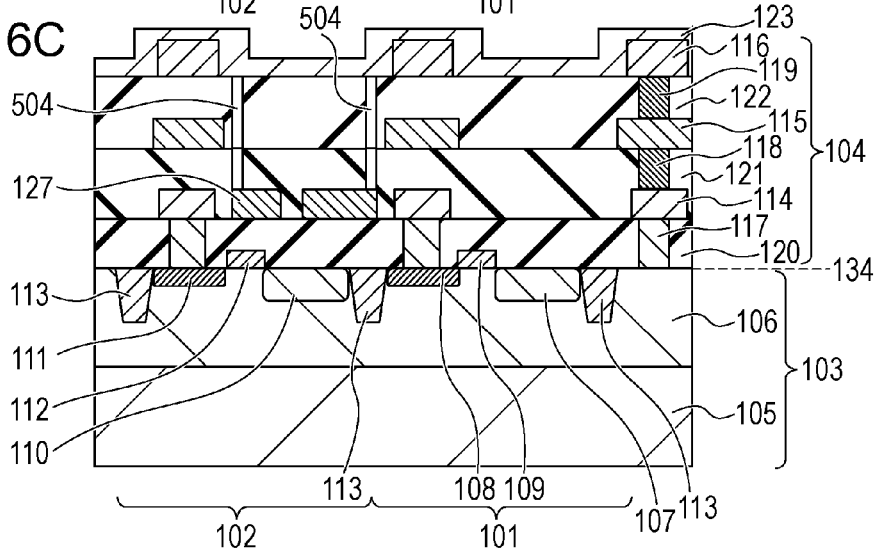
FIG. 6C is yet another schematic sectional view illustrating the method of manufacturing the solid-state image pickup device according to the second embodiment.

Referring to FIGS. 6A, 6B, and 6C, a method of manufacturing the solid-state image pickup device 500 according to the second embodiment will now be described, in which the second portion 503 is an air gap 504 (a space filled with a gas). FIGS. 6A, 6B, and 6C are schematic sectional views illustrating the method of manufacturing the solid-state image pickup device 500 according to the second embodiment. Description of steps of forming members that are the same as those employed in the first embodiment is omitted.

As illustrated in FIG. 6A, the semiconductor substrate 103 is prepared. The semiconductor substrate 103 includes some elements. And a multilayer wiring structure 104 is provided above the semiconductor substrate 103. The multilayer wiring structure 104 includes an insulating film 120, a contact layer 117, a wiring layer 114, a light shielding portion 127, a via layer 118, a wiring layer 115, a via layer 119, and a wiring layer 116. Furthermore, the multilayer wiring structure 104 includes a film 600 that is to become an insulating film 121 and a film 601 that is to become an insulating film 122.

Subsequently, as illustrated in FIG. 6B, an opening 602 is provided at a predetermined position in such a manner as to extend through the film 600 and the film 601. The opening 602 is for a second portion 503 of a light guiding portion 501 that is to be provided above a light shielding portion 127. The film 600 functions as the insulating film 121. The film 601 functions as the insulating film 122. A part of the insulating film 121 and a part of the insulating film 122 in combination form a first portion 502.

Subsequently, as illustrated in FIG. 6C, a protective film 123 is provided over the opening 602, the insulating film 122, and the wiring layer 116, whereby an air gap 504 is provided. The protective film 123 is made of, for example, a silicon nitride and is formed by plasma chemical vapor deposition (CVD). In this step, conditions of plasma CVD are adjusted so that the embedding characteristic becomes low. Alternatively, the width of the opening 602 is set to a small value. In either method, the air gap 504 can be provided, avoiding the deposition of silicon nitride in the opening 602. The conditions of plasma CVD that provide a low embedding characteristic are, for example, conditions that lower the power of a lower one of two electrodes, i.e., an upper electrode and a lower electrode, used in a plasma CVD apparatus. If the first portion 502 is made of silicon oxide, the second portion 503 may be, for example, a space filled with a gas such as ambient air, nitrogen, or an inert gas, or may be made of an organic material such as acrylic resin. If the second portion 503 is a space filled with a gas, nitrogen or an inert gas can be used as the gas, in view of the reliability of associated members. If the first portion 502 is made of silicon nitride, the second portion 503 may be made of silicon oxide as well as any of the materials mentioned above.

Subsequently, as in the first embodiment, a planarizing layer 124, a color filter layer 125, and a lens layer 126 are formed. In this manner, the solid-state image pickup device 500 illustrated in FIG. 5 is obtained.

In the second embodiment also, the presence of the light guiding portion provided at least above the light shielding portion reduces the quantity of light that may enter any PD portions of adjacent pixels. The light guiding portion according to the second embodiment is also appropriately changeable as with the light guiding portion according to the first embodiment. For example, the protective film may be formed in the step illustrated in FIG. 6A, and an opening for the second portion may be provided subsequently by a photolithographic technique and an etching technique. The depth and position of the opening are appropriately changeable. Moreover, the material of the second portion is selectable from any materials.

Third Embodiment

Figure 7:
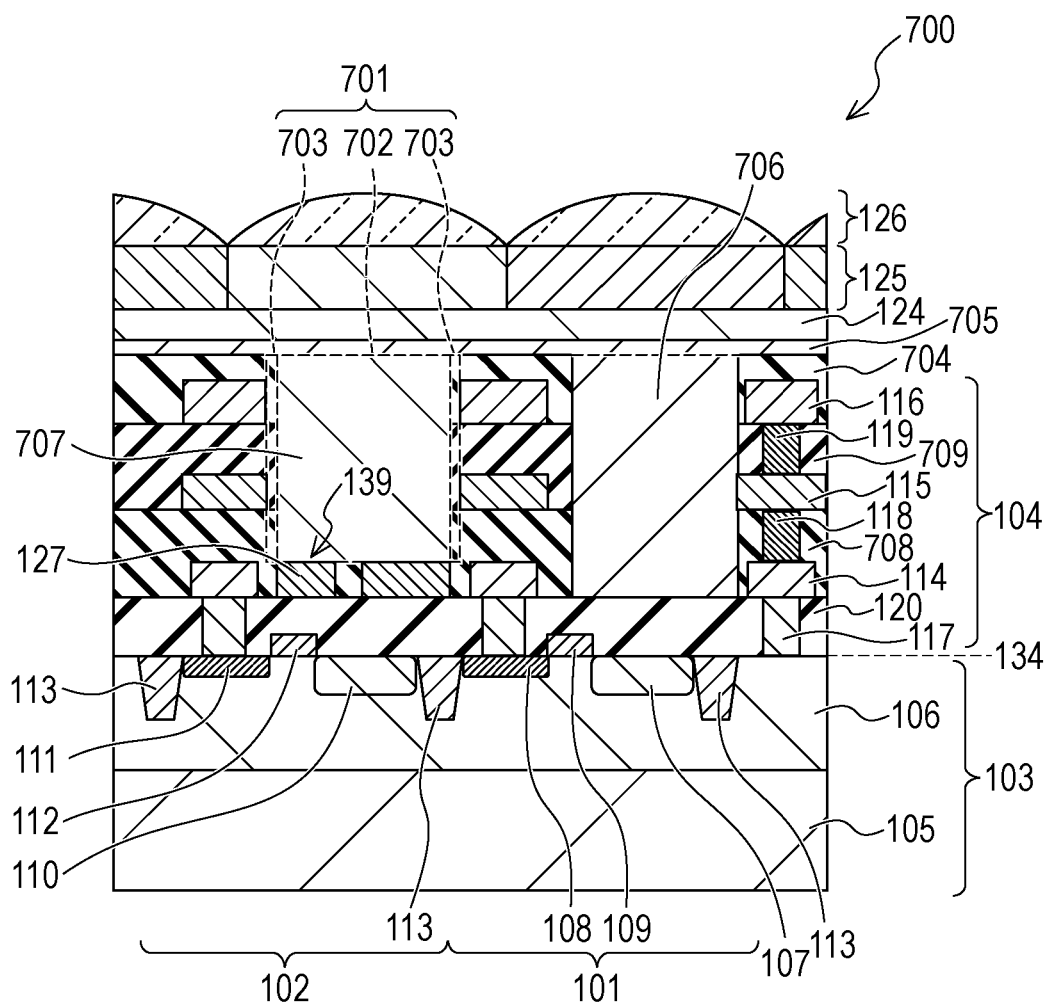
FIG. 7 is a schematic sectional view of a solid-state image pickup device according to a third embodiment.

A solid-state image pickup device according to a third embodiment differs from the solid-state image pickup device according to the second embodiment in the configuration of the light guiding portion. The solid-state image pickup device according to the third embodiment will now be described with reference to FIG. 7. In FIG. 7, members that are the same as those illustrated in FIG. 5 are denoted by corresponding ones of the reference numerals used in FIG. 5, and description of such members is thus omitted.

FIG. 7 is a schematic sectional view of a solid-state image pickup device 700 according to the third embodiment. The solid-state image pickup device 700 illustrated in FIG. 7 is the same as the solid-state image pickup device 500 illustrated in FIG. 5 in that the first portion is made of a transparent material and the second portion is made of a transparent material with a lower refractive index than the material of the first portion. In the solid-state image pickup device 500 illustrated in FIG. 5, a part of the insulating film 121 and a part of the insulating film 122 form the first portion 502. In the solid-state image pickup device 700 illustrated in FIG. 7, a part of the insulating film 121 and a part of the insulating film 122 form a second portion 703. Furthermore, a first portion 702 is made of a material, such as silicon nitride, having a higher refractive index than the material of the second portion 703. Furthermore, the first portion 702 and the second portion 703 form a light guiding portion 701. In such a configuration also, light is reflected by an interface between the first portion 702 and the second portion 703. Therefore, the quantity of light that may enter any PD portions of adjacent pixels is reduced. The configuration illustrated in FIG. 7 will now be described in detail.

The solid-state image pickup device 700 illustrated in FIG. 7 includes a semiconductor substrate 103, a multilayer wiring structure 104, a first high-refractive-index portion 706, and a second high-refractive-index portion 707. Furthermore, a protective film 705, a planarizing layer 124, a color filter layer 125 including a plurality of color filters, and a lens layer 126 including a plurality of microlenses are provided over the multilayer wiring structure 104, the first high-refractive-index portion 706, and the second high-refractive-index portion 707.

The multilayer wiring structure 104 according to the third embodiment includes an insulating film 120, a contact layer 117, a wiring layer 114, an insulating film 708, a via layer 118, a wiring layer 115, an insulating film 709, a via layer 119, a wiring layer 116, and an insulating film 704. The contact layer 117 fills openings of the insulating film 120. The via layer 118 fills an opening of the insulating film 708. The via layer 119 fills an opening of the insulating film 709. The wiring layer 114 is provided on the insulating film 120 and is covered with the insulating film 708. The wiring layer 115 is provided on the insulating film 708 and is covered with the insulating film 709. The wiring layer 116 is provided on the insulating film 709 and is covered with the insulating film 704.

The first high-refractive-index portion 706 and the second high-refractive-index portion 707 are provided in respective openings each extending through the insulating film 708, the insulating film 709, and the insulating film 704. The first high-refractive-index portion 706 is in contact with the upper face of the insulating film 120. The second high-refractive-index portion 707 is in contact with an upper face 139 of the light shielding portion 127. The insulating film 708, the insulating film 709, and the insulating film 704 are made of, for example, silicon oxide. The first high-refractive-index portion 706 and the second high-refractive-index portion 707 are made of, for example, silicon nitride. The second high-refractive-index portion 707 forms the first portion 702 of the light guiding portion 701 and has a higher refractive index than the second portion 703. Hence, light is reflected by an interface between the first portion 702 and the second portion 703. Therefore, the quantity of light that may enter any PD portions of adjacent pixels is reduced.

In the first pixel 101 also, since the first high-refractive-index portion 706 is provided, light is reflected by an interface between the first high-refractive-index portion 706 and a group of the insulating film 708, the insulating film 709, and the insulating film 704. That is, the first pixel 101 also includes a light guiding structure. In such a configuration, the quantity of light that may enter the second PD portion 110 after traveling through the first pixel 101 is reduced. In this case, the light guiding structure includes a structure that is made of the material having a low transmittance that is described in the first embodiment.

The solid-state image pickup device 700 is manufactured by the same method as for the solid-state image pickup device 500 according to the second embodiment. Specifically, a stack of a semiconductor substrate 103 and a multilayer wiring structure 104 provided thereon is prepared, and openings are provided therein. The openings are provided by etching off portions of the insulating films that are to become the first high-refractive-index portion 706 and the second high-refractive-index portion 707. Subsequently, silicon nitride is deposited in the openings by plasma CVD so as to fill the openings. Then, excessive silicon nitride that has been deposited on portions excluding the openings is removed by chemical mechanical polishing (CMP) or the like. In this step, a protective film 705 can also be formed simultaneously. Subsequently, a planarizing layer 124, a color filter layer 125, and a lens layer 126 are formed. Thus, the solid-state image pickup device 700 illustrated in FIG. 7 is obtained.

Since such a light guiding portion is also provided at least above the light shielding portion, the quantity of light that may enter any PD portions of adjacent pixels is reduced.

In the third embodiment, the first portion 702 is made of silicon nitride. Alternatively, the first portion 702 may be made of, for example, an organic material such as acrylic resin in which titanium oxide is dispersed, or styrene-based resin. In the third embodiment, the first portion 702 is integrally provided with the protective film 705. However, the first portion 702 and the protective film 705 may be made of different materials. In the third embodiment, the first high-refractive-index portion 706 and the second high-refractive-index portion 707 are each integrally provided with the protective film 705. Alternatively, the first high-refractive-index portion 706 and the second high-refractive-index portion 707 may each be separate from the protective film 705.

Pixels for Focus Detection

The solid-state image pickup device according to each of the first to third embodiments is applicable to an image pickup system that is capable of auto-focusing (AF) for correcting the phase difference in the image plane. The solid-state image pickup device according to each of the embodiments includes the first pixels and the second pixels that are provided with the microlenses, respectively. The second pixels include at least two kinds of pixels (for example, A-pixels and B-pixels). With the solid-state image pickup device according to each of the embodiments, it is possible to identify the state of focusing by comparing a first image obtained by the A-pixels and a second image obtained by the B-pixels. The microlenses provided for the individual first pixels and the individual second pixels form a real image of an exit pupil of an image taking lens included in an image pickup system, such as a camera, when rays of light emerging from the exit pupil are focused. Rays of light that are incident on the microlenses through one of two halves of the exit pupil are focused on one side of the real image, while rays of light that are incident on the microlenses through the other half of the exit pupil are focused on the other side of the real image. In this case, referring to FIG. 1B, the second pixel includes the light shielding portion having the opening provided above one of two halves of the photoelectric conversion portion. Therefore, the rays of light passing through a corresponding one of the two halves of the exit pupil are blocked, while the rays of light passing through the other half of the exit pupil are incident on the photoelectric conversion portion. In the second pixel according to each of the embodiments, rays of light passing through the right half of the exit pupil are incident on the photoelectric conversion portion. Each of the embodiments has been described focusing on the configuration of one of the pixels for focus detection included in the solid-state image pickup device applicable to an image pickup system that is capable of focus detection. The light shielding portion may cover more than half of the photoelectric conversion portion, and the position of the opening of the light shielding portion is not limited to that illustrated in FIG. 1B.

Application to Image Pickup System

Figure 8:
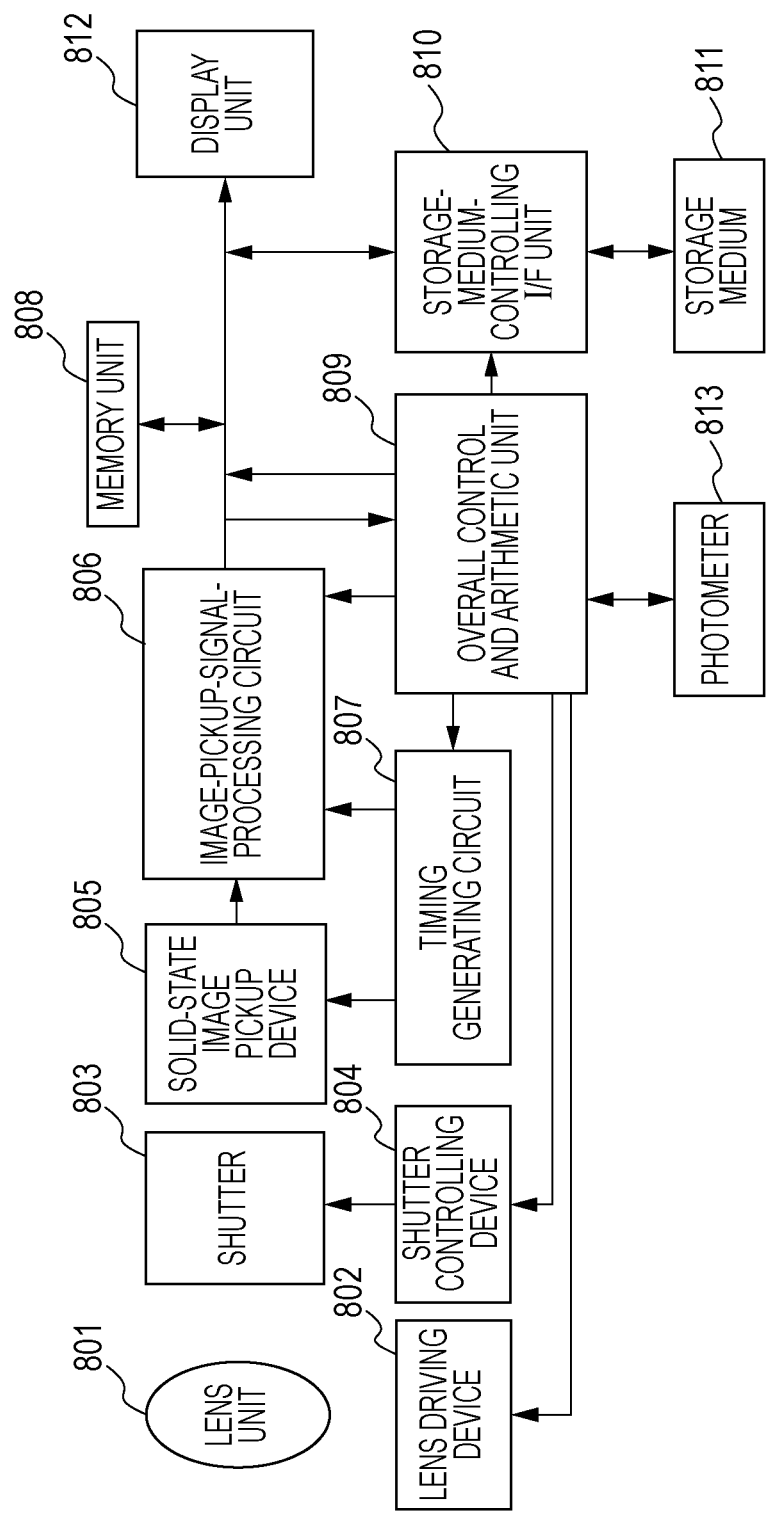
FIG. 8 is a block diagram of an exemplary image pickup system.

An image pickup system to which the solid-state image pickup device according to any of the above embodiments is applied will now be described with reference to FIG. 8. FIG. 8 is a block diagram of a digital still camera as an exemplary image pickup system to which the solid-state image pickup device according to any of the above embodiments is applied.

Referring to FIG. 8, a lens unit 801 focuses an optical image of an object onto a solid-state image pickup device 805. A lens driving device 802 drives the lens unit 801 and controls zooming, focusing, the stop value, and so forth. A mechanical shutter 803 is controlled by a shutter controlling device 804. An image-pickup-signal-processing circuit 806 generates image data by performing various corrections on image signals that are output from the solid-state image pickup device 805 and by compressing such data. A timing generating circuit 807 is a driving device that outputs various timing signals to the solid-state image pickup device 805 and the image-pickup-signal-processing circuit 806. An overall control and calculation unit 809 includes a control circuit and an arithmetic circuit. The control circuit controls arithmetic operations performed on information received from the image-pickup-signal-processing circuit 806, a photometer 813, and so forth and the overall operation of the image pickup system. The arithmetic circuit performs arithmetic processes. A memory unit 808 includes a memory that temporarily stores the image data. A storage-medium-controlling interface unit (storage-medium-controlling I/F unit) 810 performs recording on or reading from a storage medium 811. The storage medium 811 is a detachable medium, such as a semiconductor memory, on and from which image data is recorded or read. A display unit 812 displays various pieces of information and images that have been taken.

An operation performed by the above digital camera in taking an image will now be described. When a main power source is turned on, a power source for a control system is turned on. Furthermore, a power source for image pickup circuits including the image-pickup-signal-processing circuit 806 is turned on. Subsequently, when a release button (not illustrated) is pressed, the overall control and calculation unit 809 performs focusing on the basis of data received from the solid-state image pickup device 805, and calculates the distance to the object on the basis of the result of focusing. Subsequently, the lens driving device 802 drives the lens unit 801 and determines whether the image is in focus or out of focus. If it is determined that the image is out of focus, the lens unit 801 is driven and focusing is performed again. Focusing may be performed by an exclusive focusing device (not illustrated) instead of using the data from the solid-state image pickup device 805. Data for focusing may be selected between data from the solid-state image pickup device 805 and data from the exclusive focusing device.

After it has been determined that the image is in focus, an image taking operation starts. When the image taking operation ends, image signals that have been output from the solid-state image pickup device 805 are processed by the image-pickup-signal-processing circuit 806 and are written onto the memory by the overall control and calculation unit 809. Meanwhile, the image-pickup-signal-processing circuit 806 performs a sorting process or an adding process, or selects a process to be performed. Data stored in the memory unit 808 is recorded onto the storage medium 811 via the storage-medium-controlling I/F unit 810 under the control by the overall control and calculation unit 809. The data may alternatively be input to a computer or the like via an external interface unit (not illustrated) so that the image can be processed.

As described above, the solid-state image pickup device according to any of the above embodiments is applicable to an image pickup system. The concept of an image pickup system includes not only devices, such as a still camera and a camcorder, mainly having an image taking function but also devices, such as a personal computer and a mobile terminal, supplementarily having an image taking function.

With the solid-state image pickup device according to any of the above embodiments, the quantity of light that may enter any PD portions of adjacent pixels is reduced, and the accuracy of image signals or focus detection signals to be obtained is improved. Since the accuracy of such signals is improved, image processing and focus detection performed by a signal processing circuit are facilitated. Consequently, the configurations of processing units and other units are simplified.

In each of the above embodiments, examples of the opening provided for the light guiding portion includes not only a hole that extends through a certain member but also a groove that does not completely extend through a certain member while leaving a portion of that member at the bottom. Moreover, a light guiding structure may be provided in the first pixel not only in the third embodiment but also in the other embodiments.

The above embodiments are appropriately changeable. Furthermore, two or more embodiments may be combined. Moreover, the solid-state image pickup device is not limited to a CMOS apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-229038 filed Oct. 16, 2012, which is hereby incorporated by reference herein in its entirety.

What is claimed is:

1. A solid-state image pickup device comprising:
an array of a first pixel and a second pixel, the first pixel and the second pixel each including
a photoelectric conversion portion;
a microlens provided in correspondence with the photoelectric conversion portion; and
a wiring layer provided between the photoelectric conversion portion and the microlens and including a plurality of layers,
wherein the second pixel includes
a light shielding portion provided above the photoelectric conversion portion and between any two of the layers included in the wiring layer, the light shielding portion being configured to block some of incident light so as to perform focus detection; and
a light guiding portion provided at least above an upper face of the light shielding portion, and
wherein the light guiding portion includes
a first portion; and
a second portion provided around the first portion and made of a material having a lower transmittance with respect to the incident light than the first portion.

2. The solid-state image pickup device according to claim 1,
wherein the first portion is made of silicon oxide, and
wherein the second portion is made of a metallic material.

3. The solid-state image pickup device according to claim 1, wherein the second portion is surrounded by a third portion made of the same material as the first portion.

4. The solid-state image pickup device according to claim 3, wherein the third portion is made of silicon oxide.

5. A solid-state image pickup device comprising:
an array of a first pixel and a second pixel, the first pixel and the second pixel each including
a photoelectric conversion portion;
a microlens provided in correspondence with the photoelectric conversion portion; and
a wiring layer provided between the photoelectric conversion portion and the microlens and including a plurality of layers,
wherein the second pixel includes
a light shielding portion provided above the photoelectric conversion portion and between any two of the layers included in the wiring layer, the light shielding portion being configured to block some of incident light so as to perform focus detection; and a light guiding portion provided at least above an upper face of the light shielding portion, and wherein the light guiding portion includes a first portion; and a second portion provided around the first portion and made of a material having a lower refractive index with respect to the incident light than the first portion.

6. The solid-state image pickup device according to claim 5, wherein the first portion is made of silicon nitride, and wherein the second portion is made of silicon oxide.

7. The solid-state image pickup device according to claim 5, wherein the first portion is made of silicon oxide, and wherein the second portion is an air gap.

8. A solid-state image pickup device comprising:

an array of a first pixel and a second pixel, the first pixel and the second pixel each including a photoelectric conversion portion;

a microlens provided in correspondence with the photoelectric conversion portion; and a wiring layer provided between the photoelectric conversion portion and the microlens and including a plurality of layers, wherein the second pixel includes a light shielding portion provided above the photoelectric conversion portion and between any two of the layers included in the wiring layer, the light shielding portion being configured to block some of incident light so as to perform focus detection; and a light guiding portion provided at least above an upper face of the light shielding portion, and wherein an orthogonal projection of the light guiding portion onto a plane containing a light receiving face of the photoelectric conversion portion of the second pixel is contained in an orthogonal projection of the light shielding portion onto the plane.

9. A solid-state image pickup device comprising:

an array of a first pixel and a second pixel, the first pixel and the second pixel each including a photoelectric conversion portion;

a microlens provided in correspondence with the photoelectric conversion portion; and a wiring layer provided between the photoelectric conversion portion and the microlens and including a plurality of layers, wherein the second pixel includes a light shielding portion provided above the photoelectric conversion portion and between any two of the layers included in the wiring layer, the light shielding portion being configured to block some of incident light so as to perform focus detection; and a light guiding portion provided in contact with an upper face of the light shielding portion and above the upper face of the light shielding portion, the light guiding portion including a first portion and a second portion provided around the first portion and made of a material having a lower refractive index with respect to the incident light than the first portion.

10. The solid-state image pickup device according to claim 9, wherein an orthogonal projection of the light guiding portion onto a plane containing a light receiving face of the photoelectric conversion portion of each of the second pixels is contained in an orthogonal projection of the light shielding portion onto the plane.

11. An image pickup system comprising:

the solid-state image pickup device according to claim 10; and a processing unit configured to process a signal transmitted thereto from the solid-state image pickup device.

* * * * *